United States Patent [19]

Bailey et al.

[11] Patent Number: 5,059,996
[45] Date of Patent: Oct. 22, 1991

[54] APPARATUS FOR PROCESSING A PHOTOSENSITIVE ELEMENT

[75] Inventors: James S. Bailey, Wilmington, Del.;
Timothy C. Croce, Elkton, Md.;
Lawrence D. Huppman, Newark,
Del.; Michael P. Marion,
Monroeville, N.J.

[73] Assignee: E. I. Du Pont de Nemours and Company, Wilmington, Del.

[21] Appl. No.: 612,977

[22] Filed: Nov. 15, 1990

[51] Int. Cl.[5] .............................................. G03D 5/04
[52] U.S. Cl. .................................. 354/317; 354/325;
15/77; 15/100
[58] Field of Search ............... 354/317, 319, 320, 324,
354/325; 15/77, 100, 102

[56] References Cited

U.S. PATENT DOCUMENTS

| | | | |
|---|---|---|---|
| 3,671,236 | 6/1972 | Van Beusekom | 430/143 |
| 3,680,079 | 8/1972 | Casson | 354/319 X |
| 4,053,313 | 10/1977 | Fan | 430/270 |
| 4,259,434 | 3/1981 | Yamasue et al. | 430/302 |
| 4,291,117 | 9/1981 | Ohishi et al. | 430/309 |
| 4,294,533 | 10/1981 | Bratt | 354/325 X |
| 4,376,158 | 3/1983 | Spechler | 430/291 |
| 4,376,159 | 3/1983 | Spechler | 430/293 |
| 4,573,782 | 3/1986 | Kobayashi et al. | 354/299 |
| 4,588,277 | 5/1986 | Buckler | 354/317 |
| 4,656,114 | 4/1987 | Cederberg et al. | 430/160 |
| 4,666,817 | 5/1987 | Sachi | 430/160 |
| 4,737,810 | 4/1988 | Kobayashi et al. | 354/299 |
| 4,837,131 | 6/1989 | Kobayashi et al. | 430/302 |
| 4,875,067 | 10/1989 | Kanzaki et al. | 354/325 |

FOREIGN PATENT DOCUMENTS 2144867A 3/1985 United Kingdom .

Primary Examiner—A. A. Mathews
Attorney, Agent, or Firm—John E. Griffiths

[57] ABSTRACT

The present invention relates to an apparatus for processing a photosensitive element and, more particularly, for processing an aqueous developable photosensitive element which contains colorant. The apparatus comprises a a primary developing station for washing away most non-image portions from the element and a secondary developing station for washing away a remainder of the non-image portion. After the element is processed by the apparatus, the processed element forms a colored image on a support.

19 Claims, 8 Drawing Sheets

APPARATUS FOR PROCESSING A PHOTOSENSITIVE ELEMENT

BACKGROUND OF THE INVENTION

1. Field of the Invention

This invention relates to an apparatus for processing a photosensitive element and, more particularly, for processing an aqueous developable photosensitive element which contains colorant.

2. Description of Related Art

Reproduction of color images through printing is an involved process requiring a breakdown of an original image into a number of fundamental single color images and the eventual recombination of the single color images through multiple printings into a full color reproduction of the original. Color image reproduction typically includes the following steps.

First, using filtering and other photographic techniques a number of color separation transparencies or color separations are produced, typically four, each bearing a halftone dot and/or a continuous tone (contone) image corresponding, for instance, to magenta, cyan, yellow and black portions of the original. Second, a printing plate is made for each color separation by exposing a sensitized plate through one of the transparencies and developing the plate. Third, the printing plates are mounted on a multistage printing press which prints inks on a substrate, typically paper, sequentially and in register, one on top of another, four halftone and/or contone images corresponding to each of the color separations to create a full color reproduction of the original.

In the case of halftone images, the various colors are reproduced by the superposition of a multiplicity of dots of varying diameters and colors corresponding to the four color separations. Any deviation in the size or position of the printed dots results in color shifts in the final printed image. As a result of this reproduction process, setting up the press and printing a four color image is economically feasible typically only when employed for printing large quantities of a given original.

It is desirable to be able to predict the final image appearance before it is printed, and preferably before making printing plates by reviewing images made directly from the color separation transparencies. The art of evaluating the color separation transparencies and deciding whether the various colors have indeed been properly separated is called proofing. Proofing is a process which uses the color separations to create a colored image called a proof to visualize what the final printed image will look like typically without actually making printing plates and running the printing press. Proofing through the creation of proofs shows the printer and customer what the job will look like after printing, so changes can be made, if necessary, to the color separations before the job goes to press where it can waste expensive press time, paper and ink if it is not right. Proofs are used for many purposes including for customer approval, for checking compatibility of a number of subjects to be printed on the same plate or job, for internal quality checking and control, and for relatively small numbers of final reproductions.

For many years the only way to make proofs was to print them on a press. This involved making plates, mounting them on the press, making the press ready to run, and running a few prints. Proofs of this type are very expensive because they involve labor intensive operations and the use of expensive materials (e.g., plates) and cost intensive equipment (e.g., the press). Special proof presses have been built to eliminate the high costs of using production presses, but manpower costs are still high and special proof presses do not always reproduce the printing and visual characteristics of the production press. Furthermore, press proofing by either of these techniques takes a long time to make proofs.

Because of the time and expense to make press proofs attempts have been made to develop and use less expensive and faster alternatives to press proofs. These are usually made by photochemical or photomechanical means and are referred to as off-press, pre-press or pre-plate proofs.

Photochemical or photomechanical proofing systems typically use photosensitive elements in making proofs. These systems generally make proofs by exposing photosensitive elements to actinic radiation through one of the image bearing color separation transparencies to produce a duplicate image that is either a positive or a negative of the transparency depending on the element used. The radiation may make soluble areas insoluble, insoluble areas soluble, tacky areas nontacky, or nontacky areas tacky depending on the element used. After imagewise exposure, the photosensitive element can be developed by washing out soluble areas. Then tacky areas of the element may have to be toned with a dry or liquid colorant. This process is repeated for all color separations. Then the processed elements are laminated together one at a time sometimes on a support or substrate. Protective layers may be peeled apart and removed from the elements before they are laminated to the support or other image elements. Finally, the four color images may be transferred from the support to a receptor or transfer sheet, such as a sheet of paper, to form the final proof.

Many photosensitive elements used for image reproduction have the disadvantage that they must be washed out by an organic solvent or aqueous base. For instance, U.S. Pat. No. 4,053,313 to Fan discloses a photosensitive element comprising a solvent-processable photosensitive layer, a tonable elastomeric layer and a support, that is processed (i.e., washed-out) by a mixture of water and organic solvent. The elements disclosed in U.S. Pat. Nos. 4,376,158 and 4,376,159 to Speckler require aqueous base for washout. Precolored diazo based photosensitive elements which are developed in a mixture of 1-propanol and water are disclosed, for example, in U.S. Pat. No. 3,671,236 to Van Beusekom, U.S. Pat. No. 4,656,114 to Cederburg and U.S. Pat. No. 4,666,817 to Sachi. Use of organic solvents or aqueous bases frequently is undesirable due to flammability, toxicity, corrosion and/or waste disposal considerations. The photosensitive elements disclosed in these Fan and Speckler Patents also require the developed (i.e., washed-out) elements to be toned either manually or in a toning apparatus.

Photosensitive elements are known and are being developed that do not have the above described disadvantages. Specifically, U.K. Patent publication GB 2144867 B discloses photosensitive elements having entirely aqueously developable precolored layers containing a colorant on a removeable support. The U.K. Patent further describes a photomechanical process for forming a multicolor image, suitable for use as an off-press proof utilizing the aqueously developable photosensitive elements. The process for preparing a multicolor image is accomplished by (1) imagewise exposure of a first one of the precolored photosensitive elements comprising an aqueously developable precolored photosensitive layer on a removeable support through a first one of the color separation transparencies forming image areas and non-image areas in its aqueously developable precolored layer, (2) processing the exposed element to develop the color image by washing away the non-image areas with water, (3) laminating the image bearing element to a substrate, and then (4) peeling the removeable support from the image bearing element. A second color image element is made by exposing a second precolored photosensitive element with a second one of the color separation transparencies, processing to develop the color image, laminating in register the second color image element to the first color image element on the substrate and peeling the removeable support from the second color image element. By repeating the exposing, processing, laminating in register, and peeling steps two more times, a four color image can be obtained. As long as the emulsion layer of the color separation contacts the photosensitive layer in the photosensitive element during the exposure step as is preferred, the process described in this U.K. Patent results in a wrong reading proof on the substrate. This means that the image on the substrate is a mirror image of that captured in the color separations.

Often it is desirable to view the multicolored image on a receptor or a transfer sheet, such as paper, which is the same as or similar to that which will be used in the final printing run. In this case, the multicolor image is transferred to the desired receptor by laminating and then peeling away the substrate. This results in a right reading proof assuming the emulsion layer of the color separation contacts the photosensitive layer in the photosensitive element during the exposure step. A right reading proof is the same as the original image, not a mirror image.

Many apparatuses have been developed for developing photosensitive elements. Different developing apparatuses are designed and used for processing different photosensitive elements. However, aqueously developable precolored photosensitive elements are a relatively recent development. As such, few apparatuses exist for use in developing (i.e., washing out) non-image areas of aqueously developable precolored photosensitive elements.

Generally, the exposure of aqueously developable photosensitive elements through color separation transparencies form hardened and non-hardened areas corresponding to image and non-image areas on the photosensitive elements. The colored image produced after processing should have the non-hardened areas, i.e., non-image areas, and the colorant contained therein, completely washed-out or essentially completely washed-out. Any remaining non-hardened areas on the photosensitive element may affect the ability of the image bearing element to successfully transfer in lamination to the substrate. Also, any colorant which remains as a result of incomplete washout of the non-hardened areas deters from satisfactory resolution of the colored image. Thus, the apparatus for processing the photosensitive element should assure complete or essentially complete washout of the non-image areas and yet not be so harsh that it causes damage to the image areas on the element.

In accordance with the above, it is desirable to have an apparatus for processing photosensitive elements to develop an image on a support.

It is an object of this invention to provide an apparatus for processing by washing out non-image areas of a pre-exposed aqueously developable precolored photosensitive element to develop an image on a support.

It is another object of this invention to provide an apparatus for processing a pre-exposed aqueously developable photosensitive element which assures complete or substantially complete washout of the non-image areas of the photosensitive element so that optimum quality and performance of a color reproduction system is ensured.

These and other objects of the invention have been achieved in the present invention as will be clear from the following description.

SUMMARY OF THE INVENTION

The invention relates to an apparatus for processing a web or sheet of material to wash out non-image portions with water, comprising:
  a wash system comprising:
  a primary developing station comprising means for spraying water on the material such that most non-image portions are washed away;
  means for prewetting the material with water prior to the primary developing station;
  a secondary developing station comprising means for brushing the material to remove or substantially remove a remainder of the non-image portions; and
  means for wetting the brushing means with water;
  a dryer for drying the processed material;
  means for transporting the material in order through the first developing station, the second developing station, and the dryer; and
  a control system for automatically controlling the wash system, the dryer and the transporting means.

The invention further relates to an apparatus for processing a photosensitive element having an aqueously developable layer containing a colorant to form a colored image on a substrate, comprising:
  a wash system comprising:
  a primary developing station comprising means for spraying water on the element such that most non-image portions of the aqueously developable toner layer are washed away; and
    a secondary developing station comprising a cylindrical brush positioned above and generally transverse to the direction of travel of the element through the apparatus, a flat or substantially flat platform positioned generally beneath the brush such that the element is in contact with the brush and the platform when the element is transported between them, and means for rotating and oscillating the brush to remove or substantially remove a remainder of the non-image portions of the aqueously developable layer;
  a dryer for drying the processed element;
  means for transporting the element in order through the first developing station, the second developing station, and the dryer; and
  a control system for automatically controlling the wash system, the dryer and the transporting means.

The invention further relates to an apparatus for processing a photosensitive element having an aqueously developable layer containing a colorant to form a colored image on a substrate, comprising:

a wash system comprising:
  a primary developing station comprising means for spraying water on the element such that most non-image portions of the aqueously developable toner layer are washed away;
  a secondary developing station comprising means for brushing the element to remove or substantially remove a remainder of the non-image portions of the aqueously developable toner layer;
  a reservoir tank having a first inlet port and a first outlet port;
  a mixing tee connected to the first inlet port;
  a first piping or hose network connected to the mixing tee, the first network for connection to a pressurized supply of cold water, the first network including a first solenoid valve capable of turning flow on and off through the first network;
  a second piping or hose network connected to the mixing tee, the second network for connection to a pressurized supply of hot water, the second network including a second solenoid valve capable of turning flow on and off through the second network; and
  a third piping or hose network connected to the first outlet port and the spraying means, the third piping network including a pump for pumping water from the tank through the third network and a third solenoid valve capable of turning flow on and off to the spraying means;
  a first water collection compartment positioned generally beneath the primary developing station, the first compartment having an outlet;
  a fourth piping or hose network connected to the first compartment outlet and for connection to a drain;
  a second water collection compartment positioned generally beneath the secondary developing station, the second compartment having an outlet; and
  a fifth piping or hose network connected to the second compartment outlet and a second inlet of the tank allowing water in the second compartment to drain into the tank;
  a dryer for drying the processed element;
  means for transporting the element in order through the first developing station, the second developing station, and the dryer, the transporting means including the element transport rollers; and
  a control system for automatically controlling the wash system, the dryer and the transporting means.

BRIEF DESCRIPTION OF THE DRAWINGS

The invention can be more fully understood from the following detailed description thereof in connection with accompanying drawings described as follows.

DESCRIPTION OF THE PREFERRED EMBODIMENT(S)

Figure 1:
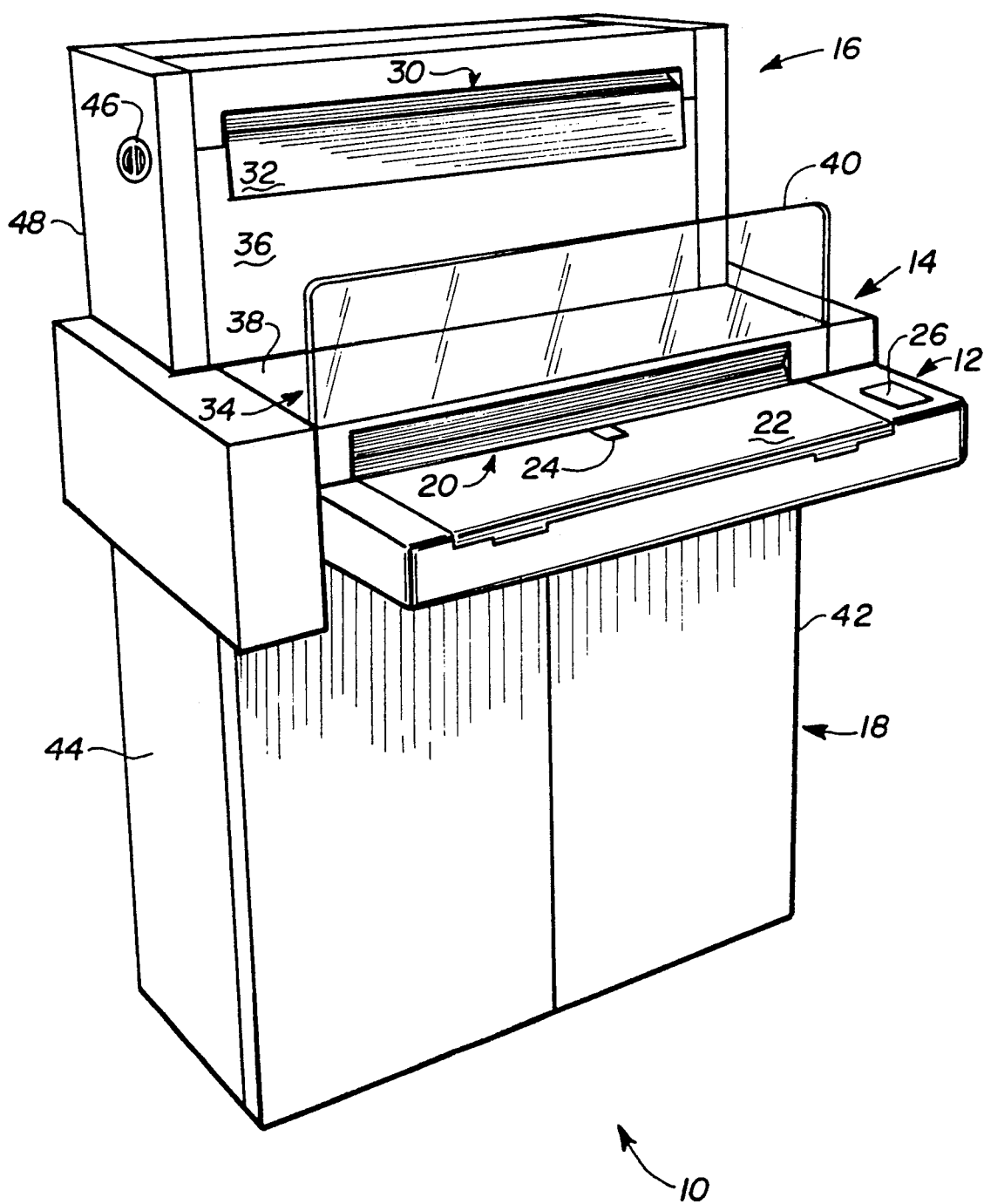
FIG. 1 is a perspective view of an apparatus for processing a precolored, aqueously developable, photosensitive element in accordance with the present invention.

Throughout the following detailed description, similar reference characters refer to similar elements in all figures of the drawings.

Referring to FIG. 1, there is illustrated a perspective view of an apparatus 10 for processing an aqueously developable element in accordance with the present invention. Preferably, the element is a photosensitive element having a sheet-like support and an aqueously developable layer containing a colorant on the support. The element can be described as a sheet or web of material or film. Thus, the apparatus 10 is for processing a photosensitive element having a support and an aqueously developable layer containing a colorant on the support to form an image or a colored image on the support. Suitable illustrative photosensitive elements that can be developed in the present invention are disclosed in U.K. Patent publication GB 2144867 B. For instance, the photosensitive elements can include, for instance, from one side to the other a base layer, a thin release layer or coating, a thin heat sealable adhesive layer or coating and a photosensitive layer.

The apparatus 10 generally comprises a film feed section 12, a film developing section 14, a film drying or dryer section 16, and a water supply and drain section 18. The film feed section 12 includes a film feed inlet 20 and a film feed table or tray assembly 22 to facilitate aligning and feeding a sheet of the material into the inlet 20. A feed sensor 24 switch, such as an optical sensor, can be located in the table assembly 22 which is adapted to generate a signal indicating the presence of an obstruction, such as a sheet of the photosensitive elements. An operator control panel 26 can be conveniently mounted on the table assembly 22 to the side of the inlet 20. The film dryer section 16 includes a processed film outlet 30 positioned on the same side of the apparatus 10 as its inlet 20 for the convenience of the operator. A tongue shaped housing portion or tongue 32 is positioned to guide the film as it exits out of the dryer section 16 into a processed film receiving tray 34.

The processed film receiving tray 34 is located between the inlet 20 and the outlet 30 and defined by a front housing portion 36 of the dryer section 16, a top housing portion 38 of the developer section 14 and a generally vertical wall 40 extending generally above the inlet 20. Preferably, the wall 40 is transparent to allow an operator to easily see what is in the try 34. Further, preferably the transparent vertical wall 40 bends generally 90° and extends along the top housing portion 38 of the developer section 14 to reduce wear by sheets of film on the top housing portion 38 of the developer section 14. See FIG. 2. When a sheet 8 of processed film having a length that is several times the distance between the front housing portion 36 of the dryer section 16 and the vertical wall 40 exits through the outlet 30, the processed sheet 8 is received in the receiving tray 34 in a generally serpentine manner as illustrated in FIG. 2.

The apparatus 10 can be further described as having a first or right side 42 and a second or left side 44. A manual transport knob or handle 46 is positioned on the left side 44 and designed to be flush with an exterior surface of a left side housing portion 48. The function of the transport knob 46 will be described later in reference to FIGS. 5 and 6.

Figure 2:
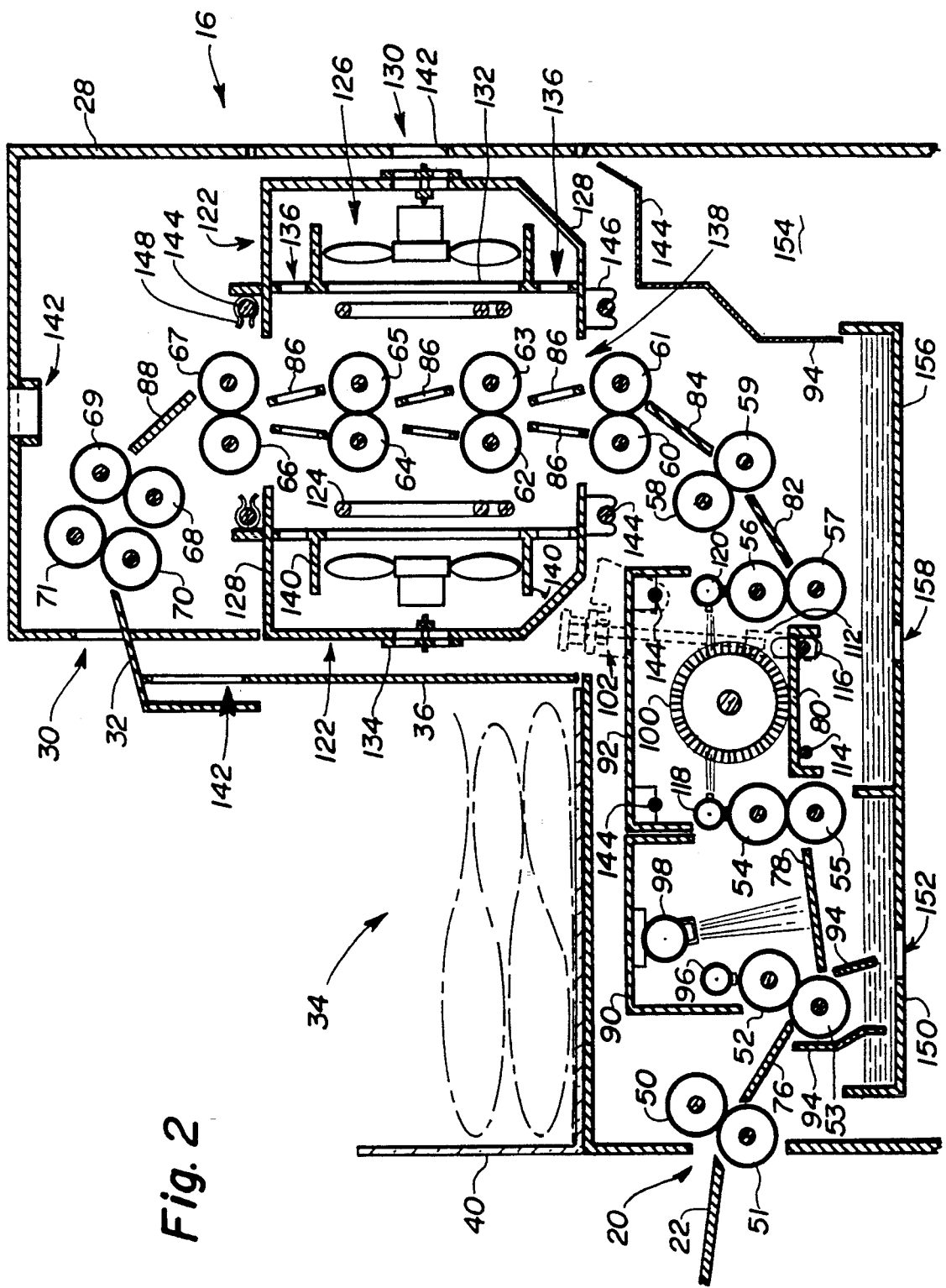
FIG. 2 is a simplified schematic cross sectional view illustrating the path that a precolored, aqueously developable, photosensitive element travels through the apparatus of the present invention.

FIG. 2 is a simplified schematic cross sectional view illustrating the path that an element travels through the apparatus 10 of the present invention. FIG. 2 illustrates element conveying rollers 50-71 which are rotatably supported between a right support plate or frame 72 and a left support plate or frame 74 (illustrated in FIGS. 5-7). Element guide plates or guides 76, 78, 80, 82, 84, 86 and 88 are positioned to direct the path of the sheet through the apparatus 10. A first pair 50,51 of the rollers 50-71 is positioned in the vicinity of the inlet 20 for pulling or drawing the sheet into the developer section 14 of the apparatus 10. The first pair 50,51 of the rollers direct the sheet onto a downward inclined first guide plate 76. The first pair 50,51 of the rollers are kept dry by a first developer section cover 90 and baffles 94. The sheet slides down the first guide plate 76 into a nip between a second pair 52,53 of the rollers.

A prewetting dribble bar 96 is positioned above the second pair 52,53 of rollers and is generally transverse to the direction of travel of the element through the apparatus 10. The prewetting dribble bar 96 is adapted to dribble or lightly spray water on a top or first roller 52 of the second pair 52,53 of rollers which wets the lower roller 53 and prewets the sheet as it is transported through the second pair 52,53 of rollers. The primary purpose of the prewetting dribble bar 96 is to prewet the second pair 52,53 of the rollers prior to the point in time that the second pair 52,53 of the rollers contact the element so that the non-image areas do not stick to and be pulled off the element support by the second pair 52,53 of the rollers.

The second pair 52,53 of the rollers direct the sheet onto a second upward inclined guide plate 78. A spray bar 98 is mounted above the second guide plate 78 and is adapted to spray water onto the sheet as it is being transported up the second guide 78. This spray is adapted to wash away most, preferably about 90 % or more, of the non-image portions of the aqueously developable precolored layer on the sheet. The second guide plate 78 is inclined from horizontal at least at the region where spray from the spray bar 98 contacts the sheet. This enables the water to flow down the second guide plate 78 from the contact region leaving the contact region substantially clear of water maximizing the impact of the spray on the film. The spray bar 98 and the second guide 78 comprise a primary developing station.

A third pair 54,55 of the rollers receive the sheet from the second guide plate 78. The third pair 54,55 of rollers transport the sheet onto a third flat or substantially flat guide platform or plate 80. The third plate 80 can be horizontal or substantially horizontal. Optionally, the platform or plate 80 can be wetted, i.e., supplied with water, such as, through passages through the platform or plate 80, to aid in the development of the photosensitive element. A cylindrical polishing brush roller or brush 100 having a longitudinal axis is positioned above the third plate 80 with the longitudinal axis generally transverse to the direction of travel of the element through the apparatus 10. The brush 100 is positioned such that the element is in contact with the brush 100 and the third platform 80 when the element is transported between them. The brush 100 is mounted such that it is capable of rotating about its longitudinal axis and oscillating along its longitudinal axis.

Figure 5:
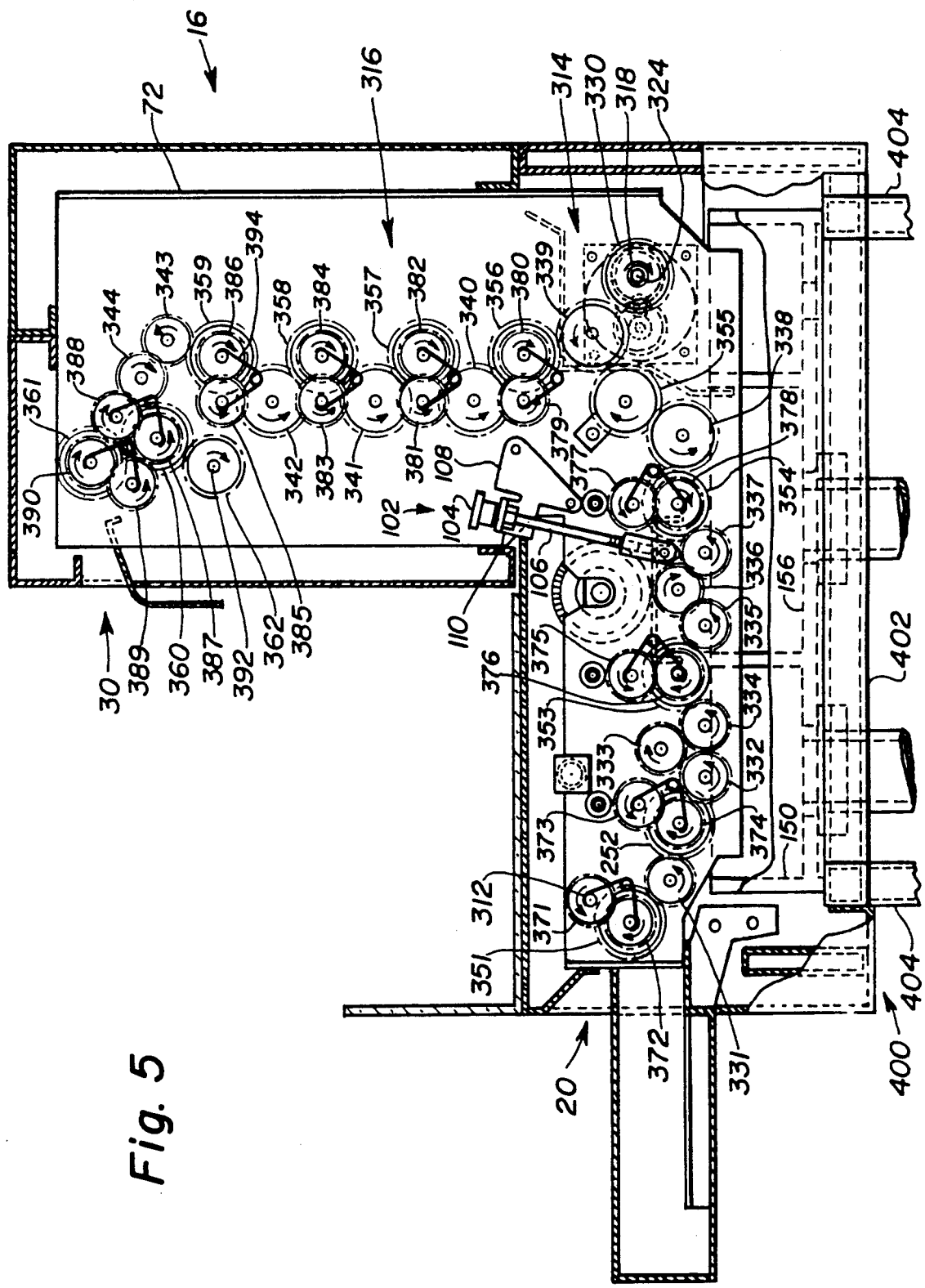
FIG. 5 is a schematic illustration of a first or right side o the apparatus with housing portions removed showing a drive mechanism for rotating conveying rollers in accordance with the present invention.
Figure 6:
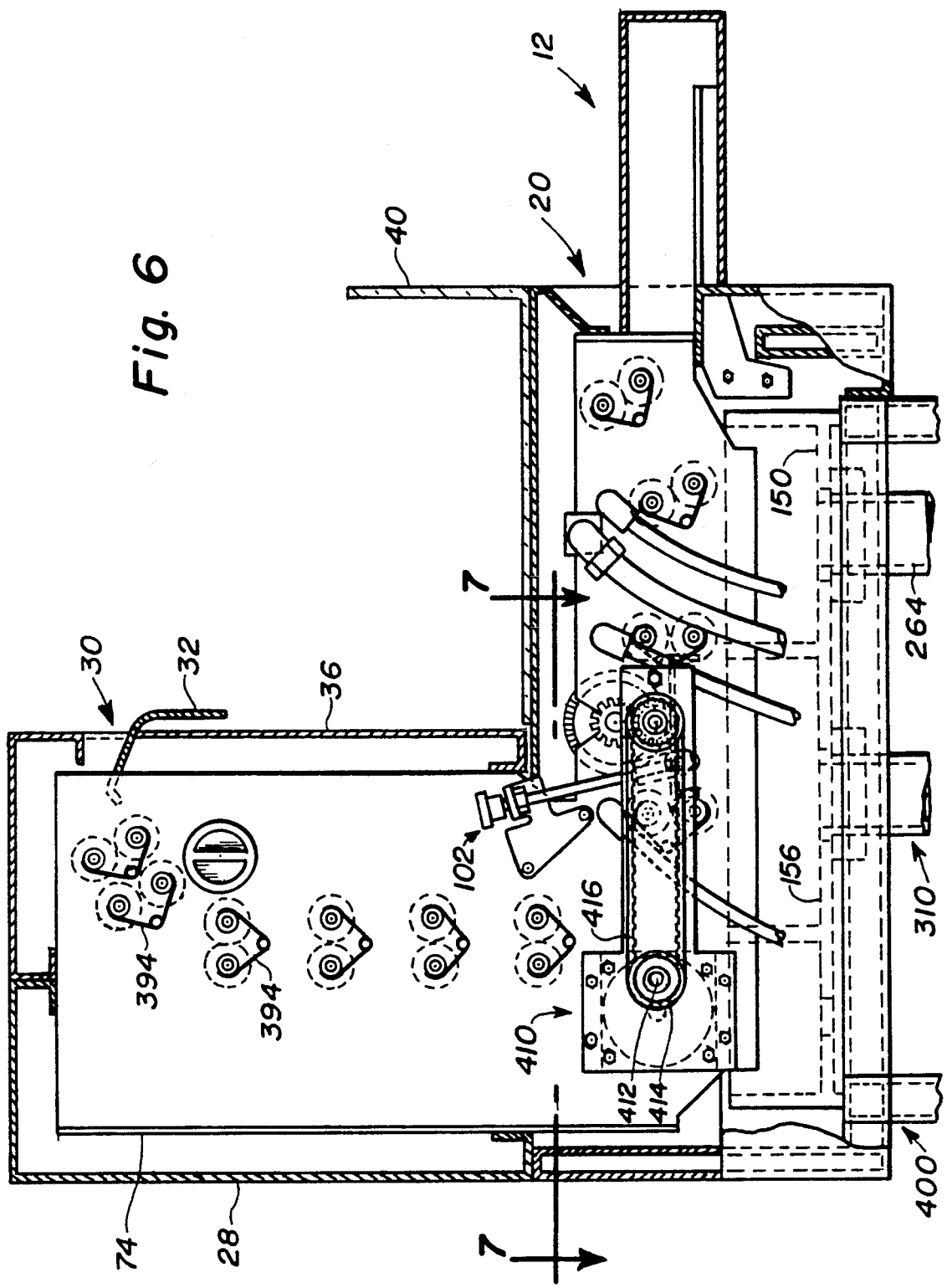
FIG. 6 is a schematic view showing a second side of the apparatus with housing portions removed illustrating how rotary motion is transmitted to the brush roller in accordance with the present invention.

The distance between the brush 100 and the third platform 80 or the force applied by the brush 100 on the third platform 80 can be adjusted by turning a platform positioning device 102 attached to the third platform 80. This enables the apparatus 10 to be adjusted to develop or wash out non-image portions of aqueously developable elements having different thicknesses and structures. The platform positioning device 102 can comprise a knob 104 fixed to one end of a shaft 106. The shaft 106 extends through a hole in a flange of a bracket 108 mounted on one of the side frames 72,74. The shaft 106 is allowed to rotate in the hole, but is prevented from moving axially through the hole by a locking nut 110 on threads on the shaft 106 trapping the flange of the bracket 108 loosely between the knob 104 and the nut 110. The other end of the shaft 106 is threadably connected to a block 112 pivotably connected to a rear end of the third platform 80. A front end of the third platform 80 is rotatably mounted on a pivot 114. Thus, the rear end of the third platform 80 can be raised or lowered by turning the knob 104 one direction which turns the shaft 106 pulling the block 112 closer to the brush 100 or by turning the knob 104 the other direction which pushes the block 112 farther from the brush 100. Preferably, there are two of the platform positioning devices 102. The bracket 108 of one of the platform positioning devices 102 is mounted on an outside surface of the right side frame 72 as illustrated in FIG. 5. The bracket 108 of the other platform positioning device 102 is mounted on an outside surface of the left side frame 74 as illustrated in FIG. 6. Each block 112 is pivotably connected to a rod 116 which extends through an elongated slot through one of the side frames 72,74. The rods 116 are connected generally to the rear end of the third platform 80.

The brush 100 and the third plate 80 comprise a secondary developing station where the development of the element is completed or substantially completed. In other words, at the secondary developing station a remainder (i.e., about 10%) of the non-image portions of the aqueously developable precolored layer are removed or substantially removed.

A first dribble and spray bar 118 is positioned above and generally transverse to the direction of travel of the element through the apparatus 10. The bar 118 is adapted to dribble water to wet the third pair 54,55 of element transport rollers between the first or primary station and the second or secondary station and adapted to spray water onto the brush 100.

The sheet is transported off the third plate 80 into a nip between a fourth pair 56,57 of the rollers. A second dribble and spray bar 120 is positioned above and generally transverse to the direction of travel of the element through the apparatus 10. The second bar 120 is adapted to dribble water to wet the fourth pair 56,57 of the rollers between the second station and the dryer section 16 and adapted to spray water onto the brush 100.

The dryer section or dryer 16 includes a plurality of pairs 58-71 of the rollers with guide plates 82,84,86 and 88 between the pairs of rollers which transport and guide the sheet between a pair of opposed heater and blower units 122 positioned to blow hot air on opposite sides of the element as it is transported and guided through the dryer 16. Preferably, the dryer section 16 includes a fifth pair 58,59, a sixth pair 60,61, a seventh pair 62,63, an eighth pair 64,65, a ninth pair 66,67, a tenth pair 68,69 and an eleventh pair 70,71 of the rollers. Each one of the pairs of the conveying rollers have a first roller and a second roller which mate with one another to drive the element through the apparatus 10. The drive arrangement will be described more thoroughly in reference to FIG. 5.

Each one of the heater and blower units 122 comprises a heating or heater element 124 and a plurality of fans 126, e.g., three fans. The fans 126 in each unit 122 are supported in a housing 128 generally between a primary air inlet 130 comprising a plurality of inlet ports positioned in the housing 128 generally on one side of the fans 126. A plurality of air outlet ports 132 are positioned in a wall of the housing 128 generally on a side of the fans 126 opposite to the inlet ports 130. The heater element 124 can be mounted on the wall such that air blown through the outlet ports 132 is blown over the heater element 124 thereby heating the blown air and directing it onto the element or material being transported through the dryer section 16. A rotatable door 134 having a plurality of ports is mounted on the housing 128 over the primary inlet ports 130. When the door 134 is rotated with respect to the housing, the amount of air that can enter the housing 128 through the inlet ports 130 changes. Thus, one can control the amount of cold or fresh air entering the housing 128 by adjusting or turning the doors 134. When the fans 126 are drawing more air than is provided from the primary inlets 130, they will draw preheated air through secondary air inlets 136 positioned in the wall from a dryer chamber 138 between the units 122. Baffles 140 in the housing 128 direct air from the secondary air inlets 136 to the appropriate sides of the fans 126. Housing portions 28,36 can be provided with ventilation slots 142 to allow air to be drawn into or blown out of the apparatus 10 by the fans 126. One purpose of the tongue 32 is to cover air inlet ventilation slots 142 so that a processed sheet 8 does not get drawn towards the ventilation slots 142 when exiting from the film outlet 30.

The heater and blower units 122 are pivotably supported on spacer or support bars 144 mounted between the right side plate 72 and the left side plate 74 of the apparatus 10 by generally U-shaped saddle clamps 146. The heater and blower units 122 are detachably fastened to another spacer or support bar 144 mounted between the right support plate 72 and the left support plate 74 of the apparatus 10 by resilient clips 148. The guides 86 in the dryer chamber 138 are not solid plates, but are constructed in a ladder-like fashion to allow air to be blown through them.

Additional rollers 66-71 and/or one or more guide plates 88 can be used to transport and guide the sheet from the dryer chamber 138 to the apparatus outlet 30 into the receiving tray 34.

A first water collection compartment 150 is positioned generally beneath the primary developing station. The first water collection compartment 150 is also positioned to collect water from the dribble bar 96 and some or all of the water that dribbles from the first dribble and spray bar 118 onto the third pair 54,55 of rollers. The first water collection compartment 150 has an outlet port 152. Baffles 94 are preferably provided to prevent or reduce splashing or spraying of water especially onto the first pair 50,51 of the rollers and/or into a rear motor compartment 154. A second water collection compartment 156 is positioned generally beneath the secondary developing station. The second water collection compartment 156 is also positioned under the rollers in the dryer 16 so that the second compartment 156 can collect liquid that is used to clean the rollers in the dryer 16. The second water collection compartment 156 has an outlet port 158. The first compartment 150 and the second compartment 158 can be entirely separate structures. Alternatively, they can be integral with one another such as being fastened together or made as one part.

Other spacer or support rods or bars 144 can be mounted between the right frame 72 and the left frame 74 to interconnect and provide rigidity between the two frames. A second developer section cover 92 can be supported on two of the spacer rods 144 over the secondary developing station to contain or control splashing or misting. The first developer section cover 90 can be supported on other spacer rods or on the spray bar 98 itself.

Figure 3:
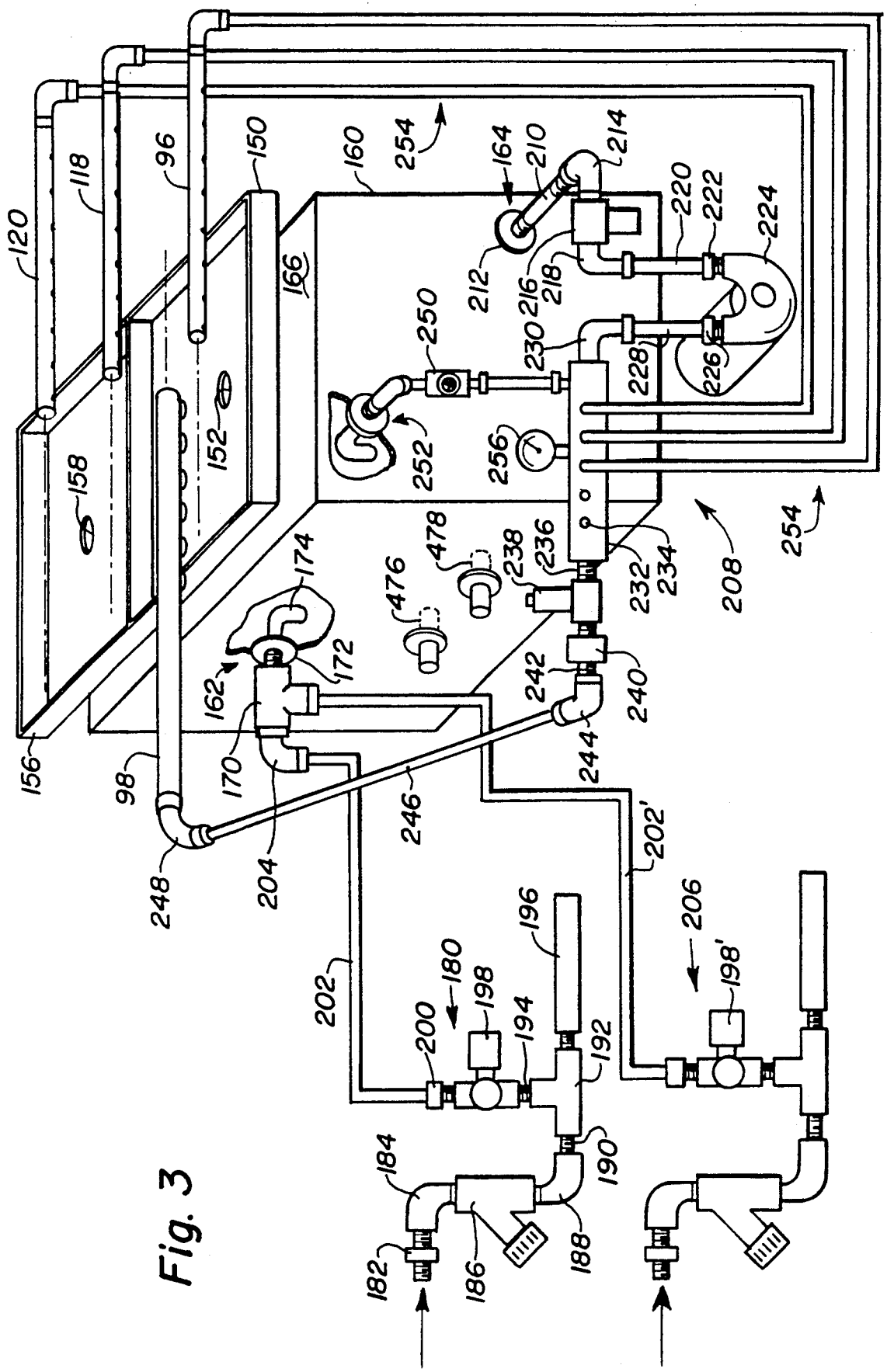
FIG. 3 is a schematic illustration of the fluid supply system of the present invention.

Referring to FIG. 3, there is illustrated a schematic view of a preferred embodiment of a water supply system of the present invention. Please note that the fluid to be supplied by the present invention need not be pure water or ordinary tap water. The fluid may contain any liquid or ingredient that does not interfer with or facilitates the development of the aqueously developable photosensitive layers on the photosensitive elements processed by the processor of the present invention. However, preferably, the fluid supplied by the present invention is ordinary tap water. The water supply system is generally located in the water supply and drain section 18 beneath the first and second water collection compartments 150,156. See FIG. 1. The water supply system may comprise a reservoir tank 160 having a first inlet port 162 and a first outlet port 164. The tank 160 may include a top or cover 166 with an inlet port 168. See FIG. 4. A mixing tee 170 is connected to the first inlet port 162, such as, by threadably connecting the tee 170 to a threaded wall defining the port 162. Alternatively, a bulkhead 172 can be inserted in the port 162 with the tee 170 connected to the bulkhead 172. An elbow 174 can be connected to the bulkhead 172 inside the tank 160 to direct water flow downward.

A first piping or hose network 180 is connected to the mixing tee 170. The first network 180 is for connection to a pressurized supply of cold water. The first network 180 may comprise a connector 182 for threadably attaching to the pressurized supply of cold water. The connector 182 can be connected to to an elbow 184. The elbow 184 can be connected to a water strainer 186. The strainer 186 can be connected to another elbow 188 which in turn can be connected to a small pipe or nipple 190. The small pipe 190 can be connected to a tee 192. The tee 192 can be also connected to another small pipe or nipple 194 and a water hammer arrestor or shock absorber 196. A solenoid valve 198 can be connected between the small pipe or nipple 194 and a connector or adapter 200 which in turn can be connected to one end of a pipe, hose or tube 202. The cold water solenoid valve 198 is capable of turning water flow on and off through the first network 180. An elbow 204 can be connected between the pipe 202 and the mixing tee 170. A second pipe (not depicted) can be connected between the elbow 204 and the mixing tee 170.

A second piping or hose network 206 is connected to the mixing tee 170. The second network 206 is for connection to a pressurized supply of hot water. The second network 206 may be the same as the first network 180, except its pipe 202', which is connected to its solenoid valve 198', can be directly connected to the mixing tee 170.

A third piping or hose network 208 interconnects the first tank outlet port 164 and the spray bar 98. The third piping network 208 may include a small pipe or nipple 210 threadably connected to a wall defining the outlet port 164. Alternatively, a bulkhead 212 can be inserted in the outlet port 164 with the pipe 210 connected to or extending through the bulkhead 212. An elbow 214 can be connected between the pipe 210 and a strainer 216. Another elbow 218 can be connected between the strainer 216 and a pipe 220. An adapter 222 can interconnect the pipe 220 to a pump 224 for pumping water from the first outlet port 164 of the tank 160 through the third network 208. The pump 224 can be a positive displacement pump driven by a motor assembly. Another adapter 226 may interconnect an output of the pump 224 with one end of another pipe 228. An elbow 230 can be connected between the other end of the pipe 228 and a distribution manifold 232 which has a plurality of outlet ports 234. A small pipe or nipple 236 can be connected between one of the ports 234 and a solenoid valve 238 capable of turning flow on and off to the spray bar 98. An adapter 240 can connect the solenoid valve 238 to a generally horizontal pipe or nipple 242. An elbow 244 can be connected between the horizontal pipe or nipple 242 and a generally vertical pipe 246. An elbow 248 can interconnect the vertical pipe 246 with the spray bar 98.

Piping or hose networks 254 can connect the prewetting dribble bar 96, the first dribble and spray bar 118 and the second dribble and spray bar 120 to ports 234 of the manifold 232. The third network 208 or another piping or hose network can include a manual valve 250 and be connected between a port 234 of the manifold 232 and a second inlet port 252 of the tank 160 for optionally directing back to the tank 160 the flow of water being pumped, rather than to the spray bar 98. A pressure gauge 56 may be connected to the manifold 232 to measure the pressure therein.

Figure 4:
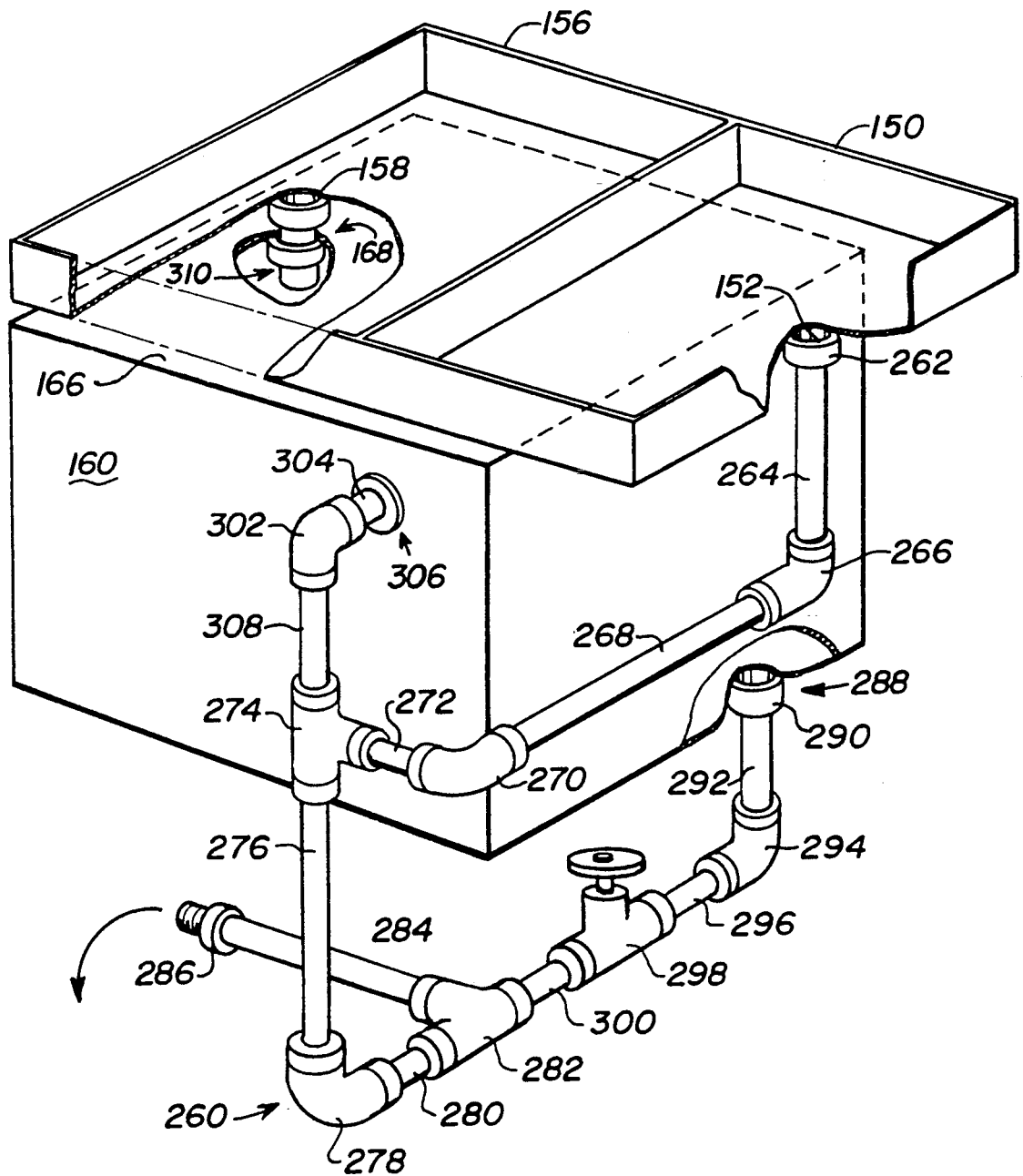
FIG. 4 is a schematic illustration of a fluid drain system of the present invention.

FIG. 4 is a schematic illustration of a fluid drain system of the present invention. Referring to FIG. 4, the fluid drain system comprises a piping or hose network 260 connected to the first compartment outlet port 152 which is adapted to be connected to a drain. This network 260 may comprise an adapter 262 for threadably attaching to mating threads in a bottom wall defining the first compartment outlet port 152. A pipe 264 can interconnect the adapter 262 with an elbow 266. A pipe 268 can connect the elbow 266 with another elbow 270. A pipe or nipple 272 can interconnect the elbow 270 with a tee 274. A pipe 276 can connect the tee 274 to an elbow 278. A pipe 280 can be connected between the elbow 278 and a drain tee 282. This tee 282 can be connected to a pipe 284 which in turn is connected to an adapter 286 for connection to a drain. Another outlet port 288 located, for instance, in a bottom wall of the tank 160 can be connected, such as, by an adapter 290 to a pipe 292 to an elbow 294. Alternatively, the elbow 294 can be directly connected to the tank 160. The elbow 294 is also connected to a pipe 296 which is connected to a manual drain valve 298 which is connected to a pipe 300. The pipe 300 is connected to the drain tee 282 or to an adapter which is connected to the drain tee 282. A tank overflow elbow 302 can be directly connected to, or connected by a pipe or nipple 304 to, another outlet port 306 of the tank 160. A pipe 308 can be connected between the elbow 302 and the tee 274.

The fluid drain system further comprises a piping or hose network 310 connected to the second compartment outlet port 158 and the inlet port 168 of the cover 166 allowing water in the second compartment 156 to drain directly into the tank 160.

FIG. 5 is a schematic illustration of a first or right side of the apparatus 10 with housing portions removed showing a drive mechanism for rotating the conveying rollers 50-71 in accordance with the present invention. The right side plate 72 is illustrated supporting ends of shafts 312 through, or hubs on ends of, the conveying rollers 50-71. The drive mechanism comprises a transport motor assembly 314, a gear arrangement 316 interconnecting the rollers 50-71, and a clutch mechanism 318 interconnecting the motor assembly 314 and the gear arrangement 316.

Figure 7:
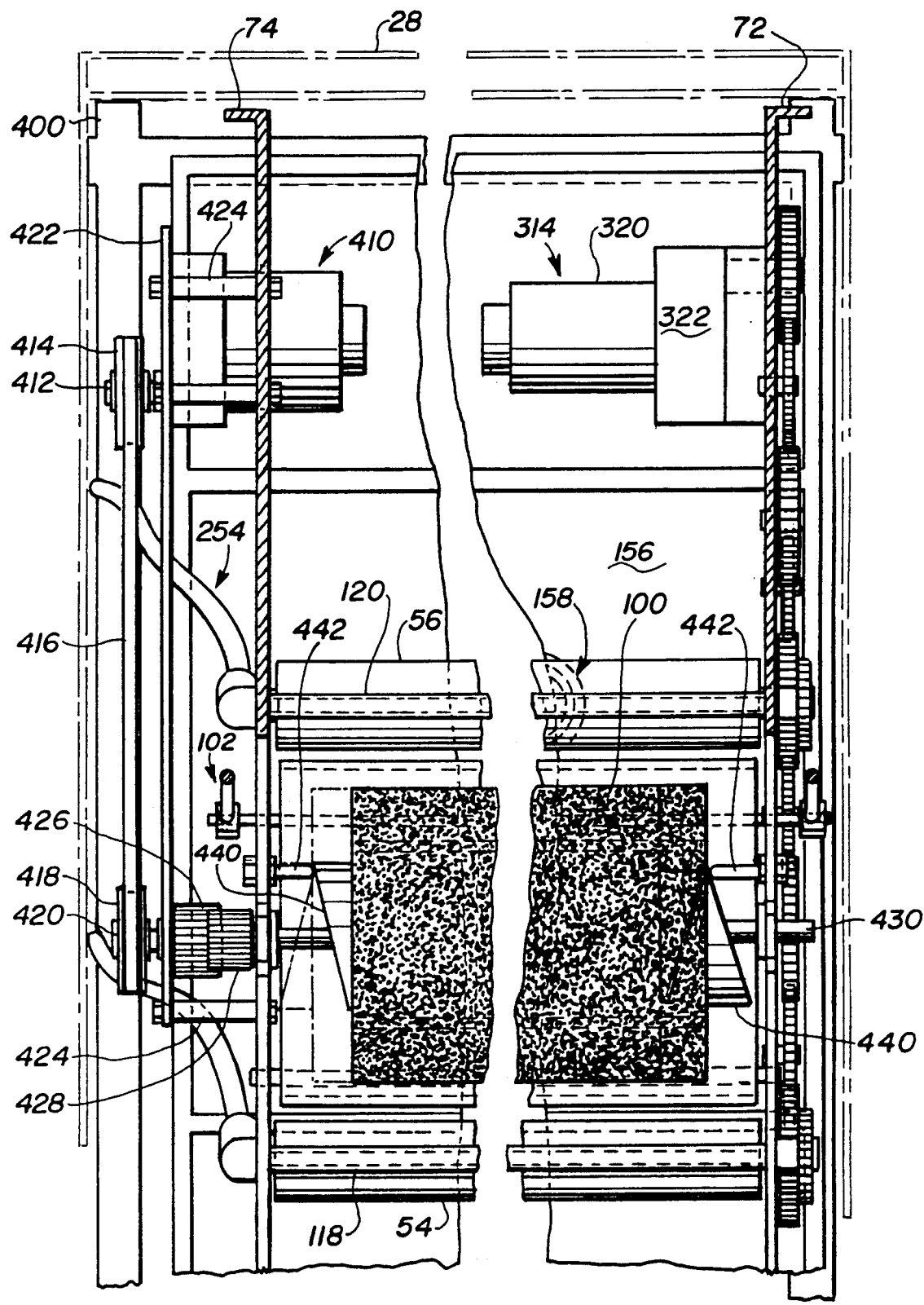
FIG. 7 is a simplified cross sectional view taken generally along line 7—7 in FIG. 6 in the direction of the arrows further illustrating how rotary motion is transmitted to the brush roller and illustrating a mechanism for oscillating brush roller along its longitudinal axis in accordance with the present invention.

The motor assembly 314, also seen in FIG. 7, may comprise a motor 320 having a rotatable shaft. A gear box 222 can be mounted on the motor 320 with gears interconnecting the motor shaft 324 with a gear box shaft such that the rotational speed of the gear box shaft 324 is reduced from that of the motor shaft.

The clutch mechanism 318 may be mounted on the motor shaft or the gear box shaft 324.

The gear arrangement 316 may include a main drive gear 330, a plurality of transfer or idler gears 331-344, a plurality of "larger" roller drive gears 351-362 and a plurality of "smaller" roller drive gears 371-390. The "larger" drive gears 351-362 are larger in diameter than the "smaller" drive gears 371-390. The main drive gear 330 can be mounted on the clutch mechanism 318 about the motor or gear box shaft 324. One of the larger drive gears 351-362 is mounted on the end of a first one of each mating pair of the conveyor rollers 50-71. One of the smaller drive gears 371-390 is mounted on the end of each conveyor roller 50-71, except smaller drive gears do not have to be mounted on either roller in a mating pair where one of the conveyor rollers in the mating pair isn't driven directly by gears in the gear arrangement 316. For instance, the first pair 58,59 of the rollers past the secondary developing station does not need smaller drive gears because the roller 58 in the pair without a larger drive gear is driven by frictional contact with the film and is, thus, more easily removed for cleaning purposes. The smaller drive gears 371-390 on mating pairs of the conveyor rollers 50-71 engage with one another. The larger drive gears 351-362 may engage other larger drive gears. Alternatively, one or more transfer gears 331-344 may be positioned between and interconnect adjacent pairs of the larger drive gears 351-362. The transfer gears 331-344 are rotatably mounted on ends of the spacer rods 144 or other shafts supported on the right side plate 72. The main drive gear 330 is positioned generally after the secondary developing station and before the dryer 16. This positions the main drive gear 330 generally in the middle of the gear arrangement 316.

A preferred embodiment of the gear arrangement 316 will now be described first from the main drive gear 330 through the dryer 16 to the film outlet 30 and then from the main drive gear 330 to the film inlet 20.

First, from the main drive gear 330 through the dryer 16 to the film outlet 30, the gear arrangement 316 preferably comprises a first one 339 of the transfer gears interconnecting the main drive gear 330 with a first one 356 of the larger drive gears. A second one 340 of the transfer gears interconnects the first larger drive gear 356 with a second one 357 of the larger drive gears. A third one 341 of the transfer gears interconnects the second larger drive gear 357 with a third one 358 of the larger drive gears. A fourth one 342 of the transfer gears interconnects the third larger drive gear 358 with a fourth larger drive gear 359. A fifth transfer gear 343 interconnects the fourth larger drive gear 359 with a sixth transfer gear 344. A fifth larger drive gear 360 interconnects the sixth transfer gear 344 with a sixth larger drive gear 361.

The first larger drive gear 356 is mounted on the end of the second roller 61 in the sixth pair 60,61 of rollers. A first smaller drive gear 380 is also mounted on the end of the second roller 61 in the sixth pair 60,61 of rollers. A second smaller drive gear 379, which connects with the first smaller drive gear 380, is mounted on the end of the first roller 60 in the sixth pair 60,61 of the rollers. Similarly, the second larger drive gear 357 is mounted on the end of the second roller 63 in the seventh pair 62,63 of the rollers. A third smaller drive gear 382 is also mounted on the end of the second roller 63 in the seventh pair 62,63 of the rollers. A fourth smaller drive gear 381, which connects with the third smaller drive gear 382, is mounted on the end of the first roller 62 in the seventh pair 62,63 of rollers. Similarly, the third larger drive gear 358 is mounted on the end of the second roller 65 in the eighth pair 64,65 of the rollers. A fifth smaller drive gear 384 is also mounted on the end of the second roller 65 in the eighth pair 64,65 of the rollers. A sixth smaller drive gear 383, which connects with the fifth smaller drive gear 384, is mounted on the end of the first roller 64 in the eighth pair 64,65 of the rollers. Similarly, the fourth larger drive gear 359 is mounted on the end of the second roller 67 in the ninth pair 66,67 of the rollers. A seventh smaller drive gear 386 is also mounted on the end of the second roller 67 in the ninth pair 66,67 of the rollers. An eighth smaller drive gear 385, which connects with the seventh smaller drive gear 386, is mounted on the end of the first roller 66 in the ninth pair 66,67 of the rollers. The fifth larger drive gear 360 is mounted on the end of the first roller 68 in the tenth pair 68,69 of the rollers. A ninth smaller drive gear 387 is also mounted on the end of the first roller 68 in the tenth pair 68,69 of the rollers. A tenth smaller drive gear 388, which connects with the ninth smaller drive gear 387, is mounted on the end of the second roller 69 in the tenth pair 68,69 of the rollers. The sixth larger drive gear 361 is mounted on the end of the second roller 71 in the eleventh pair 70,71 of the rollers. An eleventh smaller drive gear 390 is also mounted on the end of the second roller 71 in the eleventh pair 70,71 of the rollers. A twelfth smaller drive gear 389, which connects with the eleventh smaller drive gear 390, is mounted on the end of the first roller 70 in the eleventh pair 70,71 of the rollers.

The manual transport knob 46 is mounted on an end of a rotatable shaft 392. A seventh larger drive gear 362 is fixed on the rotatable shaft 392. The seventh larger drive gear 362 interconnects with the fifth larger drive gear 360. When the manual transport knob 46 is turned such that it drives the gears in the opposite direction of the arrows illustrated in FIG. 5, then the clutch mechanism 318 disengages the motor assembly 314 and allows rotation of the rollers 50-71 without turning the gear box shaft 324 and, thereby, the motor shaft. The manual transport knob 46 facilitates rotation of the rollers 50-71 for cleaning or unjamming purposes.

From the main drive gear 330 to the film inlet 20, the gear arrangement 316 preferably comprises the first transfer gear 339 interconnecting the main drive gear 330 with an eighth one 355 of the larger drive gears. A seventh one 338 of the transfer gears interconnects the eighth larger drive gear 355 with a ninth one 354 of the larger drive gears. An eighth one 337 of the transfer gears interconnects the ninth larger drive gear 354 with a ninth one 336 of the transfer gears. A tenth one 335 of the transfer gears interconnects the ninth transfer gear 336 with a tenth larger drive gear 353. An eleventh transfer gear 334 interconnects the tenth larger drive gear 353 with a twelfth transfer gear 333. A thirteenth transfer gear 332 interconnects the twelfth transfer gear 333 with an eleventh larger drive gear 352. A fourteenth transfer gear 331 interconnects the eleventh larger drive gear 352 with a twelfth larger drive gear 351.

The eighth larger drive gear 355 is mounted on the end of the second roller 59 in the fifth pair 58,59 of rollers. The ninth larger drive gear 354 is mounted on the end of the second roller 57 in the fourth pair 56,57 of the rollers. A thirteenth smaller drive gear 378 is also mounted on the end of the second roller 57 in the fourth pair 56,57 of the rollers. A fourteenth smaller drive gear 377, which connects with the thirteenth smaller drive gear 378, is mounted on the end of the first roller 56 in the fourth pair 56,57 of rollers. Similarly, the tenth larger drive gear 353 is mounted on the end of the second roller 55 in the third pair 54,55 of the rollers. A fifteenth smaller drive gear 376 is also mounted on the end of the second roller 55 in the third pair 54,55 of the rollers. A sixteenth smaller drive gear 375, which connects with the fifteenth smaller drive gear 376, is mounted on the end of the first roller 54 in the third pair 54,55 of the rollers. Similarly, the eleventh larger drive gear 352 is mounted on the end of the second roller 53 in the second pair 52,53 of the rollers. A seventeenth smaller drive gear 374 is also mounted on the end of the second roller 53 in the second pair 52,53 of the rollers. An eighteenth smaller drive gear 373, which connects with the seventeenth smaller drive gear 374, is mounted on the end of the first roller 52 in the second pair 52,53 of the rollers. Similarly, the twelfth larger drive gear 351 is mounted on the end of the second roller 51 in the first pair 50,51 of the rollers. A nineteenth smaller drive gear 372 is also mounted on the end of the second roller 51 in the first pair 50,51 of the rollers. A twentieth smaller drive gear 371, which connects with the nineteenth smaller drive gear 372, is mounted on the end of the first roller 50 in the first pair 50,51 of the rollers.

Thus, when the motor 320 drives or turns the gear box shaft 324 clockwise in FIG. 5, the main drive gear 330 drives or rotates the gears in the gear arrangement 316 in the direction of the arrows on the gears illustrated in FIG. 5.

The ends of the shafts or hubs 312 of the mating pairs of the conveyor rollers 50-71 extend through holes in the right and left side frames 72,74. The holes are preferably slightly larger than the diameters of the shafts or hubs 312. Spring clips 394 interconnect and bias the ends of the shafts or hubs 312 of the mating pairs of the conveyor rollers 50-71 towards one another.

The right side plate 72 and the left side plate 74 can be connected, such as by nut and bolt assemblies (not illustrated), to the first water collection compartment 150 and the second water collection compartment 156. FIG. 5 illustrates that the first water collection compartment 150 and the second water collection compartment 156 can be supported on a base frame 400 comprising interconnected horizontal bars 402 and vertical bars 404. The housing portions 28 can be connected, such as by nut and bolt assemblies (not illustrated), to the right side frame 72, the left side frame 74 and/or the base frame 400.

FIG. 6 is a schematic view showing a second side of the apparatus 10 with housing portions removed illustrating a mechanism or means for rotating the brush roller 100 in accordance with the present invention. The mechanism or means for rotating the brush roller 100 comprises a brush motor assembly 410, such as one similar to transport motor assembly 314, adapted to rotate a shaft. A first pulley 414 is fixed to rotate with the shaft 412. A belt 416 interconnects the first pulley 414 with a second pulley 418. See FIG. 7. The second pulley 418 is fixed on a first end of a shaft 420 rotatably supported through a support plate 422 mounted on the left side frame 74 such as by nut and bolt assemblies 424. A first gear 426 is fixed to the other end of the rotatable shaft 420. A second gear 428, which engages the first gear 426, is fixed to an end of a brush shaft 430 through, or a hub, on the brush roller 100. Thus, when the brush motor assembly 410 is activated, it rotates, in turn, the shaft 412, the first pulley 414, the belt 416, the second pulley 418, the first gear 426, the second gear 428 and, thereby, the brush roller 100.

FIG. 7 is a simplified cross sectional view taken generally along line 7—7 in FIG. 6 in the direction of the arrows further illustrating a mechanism or means for oscillating the brush roller 100 along its longitudinal axis in accordance with the present invention. The mechanism or means for oscillating the brush roller 100 comprises a cam or camming block 440 mounted on each end of the brush roller shaft or hubs 430. The camming blocks 440 are cylindrical with flat non-parallel end surfaces. The mechanism or means for oscillating the brush roller 100 further comprises detents or projections 442 extending from the right side plate 72 and the left side plate 74 contacting or almost contacting outer sides of the camming blocks 440. Thus, when the rotating means rotates the brush roller 100 about its longitudinal axis, the detents 442 contact and guide the position of the outer surfaces of the camming blocks 440 causing the brush roller 100 to oscillate along its longitudinal axis.

Therefore, the rotating means and the oscillating means comprise means for rotating the brush about its axis and oscillating the brush 100 along its axis.

Figure 8:
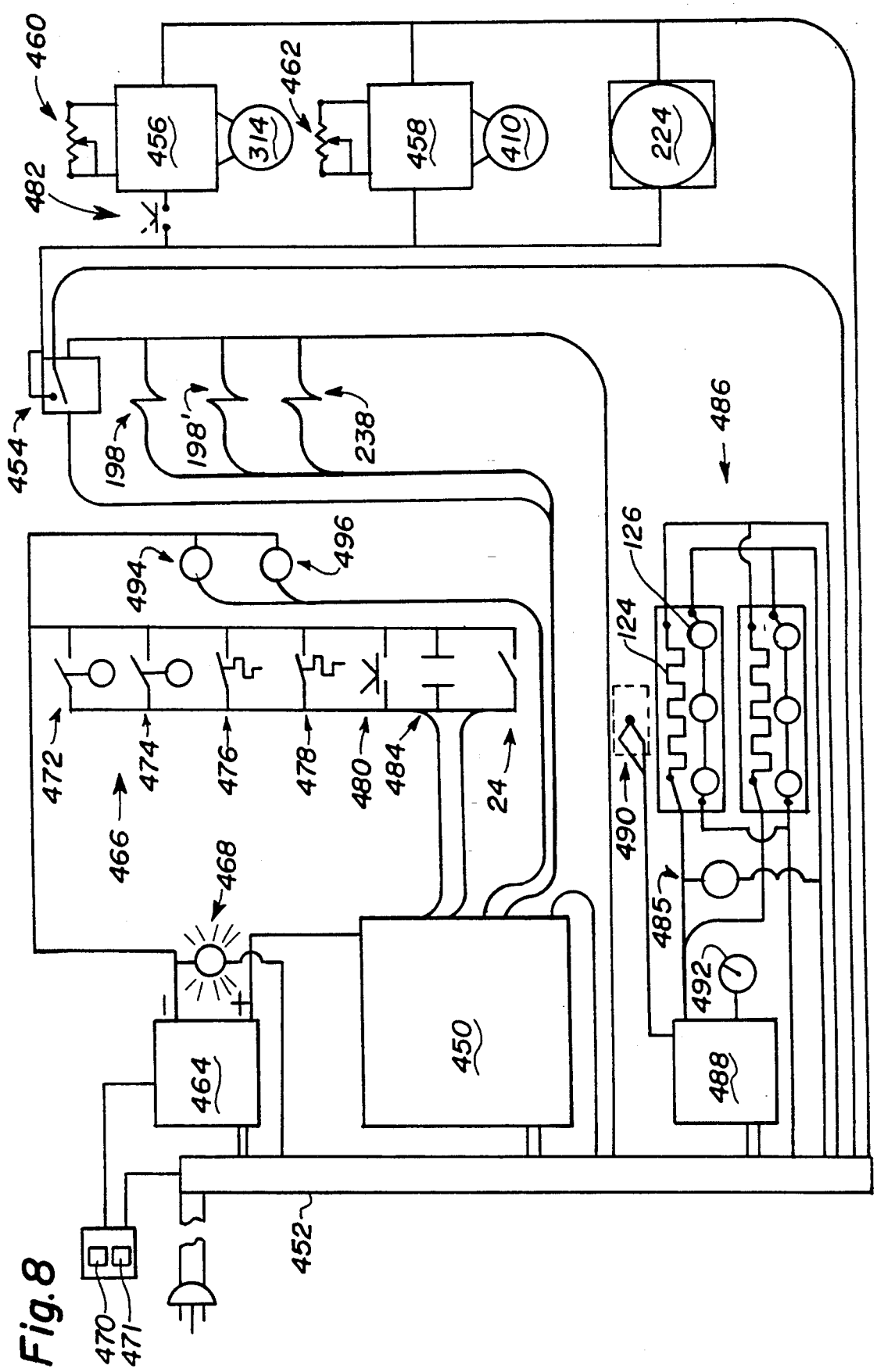
FIG. 8 is a schematic illustration of an electrical control system for the present invention.

FIG. 8 is a schematic illustration of an electrical control system for the present invention. The electrical control system includes a programmable logic controller (PLC) 450 connected to a power distribution network 452 or the like. A suitable PLC 450 that can be used in the present invention is commercially available under model number D100CR14 from Cutler Hammer with offices in Philadelphia, Pa. The power distribution network 452 may include fuse blocks, terminal blocks and interconnections between components of the control system. The cold water solenoid valve 198, the hot water solenoid valve 198', and the spray bar solenoid valve 238 can be connected between the PLC 450 and the power distribution network 452.

An output control relay (OCR1) 454 is connected between the PLC 450 and a parallel connection of a transport motor control assembly 456, a brush motor control assembly 458 and the spray pump 224. The transport motor control assembly 456 is connected by lines to the transport motor assembly 314. Similarly, the brush motor control assembly 458 is connected by lines to the brush motor assembly 410. Variable potentiometers 460, 462 can be the brush motor control assembly 458 for setting the speed of the motors in the motor assemblies 314 and 410.

A low voltage D.C. power supply 464, such as a 24 volt source, can be connected by lines to the power distribution network 452, the PLC 450 and a set of remote sensor or input device 466. A power lamp 468, which can be located on the control panel 26, can be connected between the D.C. power supply 464 and the power distribution network 452. A "power on" switch 470 and a "power off" switch 471 can be connected in a line between the power distribution network 452 and the D.C. power supply 464. The remote sensor or input devices 466 can be connected between the D.C. power supply 466 and the PLC 450. There are preferably separate input lines connected from the PLC 450 to the devices 466.

One of the devices 466 can be a high level float switch 472 which is positioned inside the tank 160 and closes (or opens) when the water level in the tank 160 reaches a high level of interest. When the high level float switch 472 sends a signal to the PLC 450 that water has reached the high level, the PLC 450 can be programmed to close the hot water and cold water solenoid valves 198, 198' stopping the supply of water into the tank 160. Another one of the devices 466 can be a low or operating level float switch 474 positioned inside the tank 160 which opens (or closes) when the water level in the tank 160 reaches a low or operating level of interest. When the low level float switch 474 sends a signal to the PLC 450 that water has lowered below the low level, the PLC 450 can be programmed to open the hot water and cold water solenoid valves 198,198' (depending on feedback from temperature sensors) supplying water into the tank 160.

A pair of the devices 466 can be a high temperature sensor 476 and a low temperature sensor 478 positioned inside the tank 160.

Another one of the devices 466 can be a manual bypass switch (SW2-A) having half its contacts 482 in an input line to the the transport motor control assembly 456. Activating the bypass switch 480 can also signal the PLC 450 to override other procedures, such as time out logic ending a preprogrammed period of time for spraying water through the spray bar 98.

Another one of the devices 466 can be a contact portion 484 of an output temperature control relay switch. The optical switch 24 can be connected like one of the devices 466. A feed ready lamp 494 and an error lamp 496 can be connected between the PLC 450 and the D.C. power supply 464. Both of these lamps 494,496 can be located on the control panel 26.

The electrical control system includes a dryer control subsystem 486 for controlling the operation of the dryer 16. The dryer control subsystem 486 includes a temperature control assembly 488 connected to the power distribution network 452. The heating elements from both of the units 122 are connected to the temperature control assembly 488 in parallel with one another. The heating elements 124 are also connected to the power distribution network 452. A temperature sensor 490, such as a thermocouple probe, can be connected to the temperature control assembly 488 and positioned to sense the temperature in the dryer chamber 138. The temperature control assembly 488 can have a remote temperature set point and/or device 492. The fans 126 in one of the units 122 can be connected in parallel or in series with one another. Similarly, the fans 126 in the second unit 122 can be connected in parallel or in series with one another. Each end of the first set of fans 126 and the second set of fans 126 are connected to the power distribution network 452 in parallel with each other. A coil portion 485 of an output temperature control switch can be connected between an input line to one of the heater elements 124 and an output line connecting the parallel connected sets of fans 126 to the power distribution network 452.

The operation of the apparatus starts or stops when the "power on" switch 470 is activated. Activation of the "power on" switch 470 allows the low voltage D.C. power supply 464 to turn the power lamp 468 on and activates a set of relays in the power distribution network 452 providing power to the electrical control system. Then the PLC 450 checks to see if it is receiving a signal from the high level float switch 472. Water never reaches the high level unless there is a problem. For instance, the overflow outlet 306 could be plugged. If at any time the PLC 450 senses a signal from the high level float switch 472, then the PLC 450 will (1) send a signal to flash or appear on the error lamp 496, (2) turn off the hot water valve 198', the cold water valve 198 and the spray valve 238, and (3) turn off the transport motor assembly 314, the brush motor assembly 410 and the spray pump 224. The "power off" switch 471 must then be pressed, the problem corrected, and then the "power on" switch 470 turned back on before the system will operate again.

Upon startup, after checking whether a signal is being sent by the high level float switch 472, the PLC 450 checks to see if it is receiving a signal from the low level float switch 474. If the low level float switch 474 is generating a signal (and the high level float switch 472 is not generating a signal), then the water is at the operating level in the tank 160. If the low level float switch 474 is not generating a signal (and the high level float switch 472 is not generating a signal), then the water is below the operating level in the tank 160. Under these circumstances, the PLC 450 will open the hot water valve 198' and/or the cold water valve 198 based on signals from the temperature sensors 476,478 until the low level float switch 474 generates a signal or until a preset time period has elapsed, whichever occurs first. When the low level float switch 474 generates a signal, the PLC 450 closes the hot water valve 198' and the cold water valve 198. In the startup procedure, the PLC 450 will measure the time before it receives a signal from the low level float switch 474. If the time period exceeds the preset time period, such as 90 seconds, then the PLC 450 will (1) send a signal to flash or appear on the error lamp 496, (2) turn off the hot water valve 198', the cold water valve 98 and the spray valve 238, and (3) turn off the transport motor assembly 314, the brush motor assembly 410 and the spray pump 224. In this situation, the "power off" switch 471 again must then be pressed, the problem corrected, and then the "power on" switch 470 pressed before the system will operate.

During startup, standby and under normal operating conditions, when the PLC 450 determines that no signal is being received from the low level float switch 474, it then determines whether signals are being received from either or both of the temperature sensors 476,478. As explained above, if the low temperature sensor 478 and the high temperature sensor 476 are not generating signals (e.g., the water temperature is below 70° F.), the PLC 450 can be programmed to keep the cold water solenoid valve 198 closed and the hot water solenoid valve 198' open. If the low temperature sensor 478 is generating a signal and the high temperature sensor 476 is not generating a signal (e.g., the water temperature is between 70° F. and 72° F.), the PLC 450 can be programmed to keep both the hot water solenoid valve 198' and the cold water solenoid valve 198 open. If both the low temperature sensor 478 and the high temperature sensor 476 are generating signals (e.g., the water temperature is above 72° F.), the PLC 450 can be programmed to close the hot water solenoid valve 198' and open the cold water solenoid valve 198.

As soon as power is sent through the power distribution network 452, current is sent through the temperature control assembly 486 to the heater elements 124 which begin to heat up. This energizes the coil portion 485 of the temperature control switch closing contact portion 484 of the switch and sending a signal to the PLC 450. The PLC 450 is programmed to count for a predetermined number of breaks (e.g., 3–5) in this signal from the contact portion 484 which indicates that the dryer 16 is at operating temperature. To elaborate, when the heater elements 124 are first turned on, they are initially cold. The temperature probe 490 indicates to the temperature control assembly 488 when the heater elements 124 reach a temperature that is a percentage (such as, 80 percent) of their desired operating temperature. In response, the temperature control assembly 488 adjusts by temporarily turning off the power supplied to the heater elements 124 so that the temperature of the heater elements 124 increases smoothly to level at the operating temperature, rather than increasing beyond the operating temperature. When the temperature control assembly 488 turns off the power or current to the heater elements 124, this breaks the signal to the PLC 450 from the output temperature control switch contact portion 484.

Once the PLC 450 senses that (1) no signal is received from the high level float switch 472, (2) the water operating level has been reached (i.e., upon receipt of a signal from the low level float switch 474), and (3) the dryer 16 is at operating temperature, then both the hot water valve 198' and the cold water valve 198 are closed, the spray bar valve 238 is opened, the pump 224 is turned on, and the transport and brush motor assemblies 314,410 are turned on for an initial period of time, such as about 20 seconds. This prewets everything in the apparatus that should be wet. Then the PLC 450 energizes the feed ready lamp 494 and the apparatus 10 enters a standby mode ready to process an aqueously developable photosensitive element.

During the standby mode, the PLC 450 will monitor signals from the high and low level float switches 472,474. If a signal stops coming from the low level float switch 474 during the standby mode, the PLC 450 will open the hot water valve 198' and/or the cold water valve 198 as described with respect to the startup mode. Similarly, if a signal stops coming from the low level float switch 474 during the standby mode, the PLC 450 will measure the time between signals that it receives from the low level float switch 474. If the time period exceeds a preset time period, such as 15–20 seconds, then the PLC 450 (1) will send a signal to flash or appear on the error lamp 496, (2) will turn off the hot water valve 198′, the cold water valve 198 and the spray valve 238, (3) will keep off the transport motor assembly 314, the brush motor assembly 410 and the spray pump 224, and (4) will turn the feed ready lamp 494 off.

When the apparatus 10 is in the standby mode, placing a photosensitive element on the feed tray 22 near the film inlet 20 activates the optical switch 24 which sends a signal to the PLC 450. In response, the PLC 450 turns off the feed ready lamp 494 and activates the relay switch 454 to turn on the transport motor assembly 314, the brush motor assembly 410, the spray pump 224 and the spray valve 238. The transport motor assembly 314 causes the conveyor rollers 50-71 to pull the leading edge of the element into the feed inlet 20. Once the trailing edge of the element passes the optical switch 24, the switch 24 stops sending a signal to the PLC 450. From this point in time the PLC 450 counts a first specified preset period of time, such as 5 seconds. After this specified period of time, the PLC 450 reactivates the feed ready lamp 494 which indicates that another element can be fed into the feed inlet 20. After a second specified preset period of time, such as 20 seconds, from the point in time that the trailing edge passes over the optical switch 24, the PLC 50 will turn the spray valve 238 off (unless another element has been inserted into the feed inlet 20). After a third specified preset period of time, such as 75 seconds, from the point in time that the trailing edge passes over the optical switch 24, the PLC 450 will turn the motor assemblies 314,410 and pump 224 off, placing the apparatus 10 back in the standby mode (unless another element has been inserted into the feed inlet 20). The third specified preset period of time should be long enough to transport the element entirely through the apparatus 10.

During the normal processing mode of the apparatus 10, the PLC 450 will monitor signals from the high and low level float switches 472,474. When a signal stops coming from the low level float switch 474 (such as when the spray bar 238 is spraying water), the PLC 450 can be set to measure the time between signals that it receives from the low level float switch 474. Then if the time period exceeds a preset time period, such as 15-20 seconds, then the PLC 450 (1) will send a signal to flash or appear on the error lamp 496, (2) will not turn off the hot water valve 198′, the cold water valve 198 and the spray valve 238, and (3) will not turn off the transport motor assembly 314, the brush motor assembly 410 and the spray pump 224. In this situation, the valves, motors and pump are not turned off because there may be a photosensitive element in the apparatus 10 being developed. After time has passed to allow the element to be developed, the apparatus locks out in its error state and can not be reactivated until the error is corrected.

The by-pass switch 480 enables a "footprint" of the brush 100 to be developed on a localized area of the material. Toggling the by-pass switch 480 opens the contacts 482 of half of the switch 480 in the input to the transport motor control assembly 456 thereby deactivating the transport motor assembly 314. The other half of the contacts of switch 480 provide a signal to an input to the PLC 450 telling it to delay completion of the process. If an element is in the apparatus 10 positioned under the brush 100 when the by-pass switch 480 deactivates the transport motor assembly 314, the brush 100 continues to scrub the element contacting the brush 100. After a period of time the by-pass switch 480 can be deactivated, allowing the transport motor assembly 314 to start again to transport the element through and out of the apparatus 10. The processed element can then be inspected to see if the element has been evenly scrubbed across the element. The scrub pattern on the element is the "footprint". If not evenly scrubbed, the height of the platform 80 can be adjusted, such as, by the adjusting means 102 to provide even scrubbing.

Those skilled in the art, having the benefit of the teachings of the present invention as hereinabove set forth, can effect numerous modifications thereto. These modifications are to be construed as being encompassed within the scope of the present invention as set forth in the appended claims.

What is claimed is:

1. An apparatus for processing a web or sheet of material to wash out non-image portions with water, comprising:
   a wash system comprising:
      a primary developing station comprising means for spraying water on the material such that most non-image portions are washed away;
      means for prewetting the material with water prior to the primary developing station;
      a secondary developing station comprising means for brushing the material to remove or substantially remove a remainder of the non-image portions; and
      means for wetting the brushing means with water;
   a dryer for drying the processed material;
   means for transporting the material in order through the first developing station, the second developing station, and the dryer; and
   a control system for automatically controlling the wash system, the dryer and the transporting means.

2. The apparatus of claim 1, wherein the primary developing station further comprises:
   a guide positioned to support and guide the direction of the material at a region where the spraying means is directed to spray water on the material, the guide inclined from horizontal to permit water to flow away from the spray contacting region on the material.

3. The apparatus of claim 1, wherein the prewetting means comprises:
   a dribble bar positioned above and generally transverse to the direction of travel of the material through the apparatus.

4. The apparatus of claim 1, wherein the transporting means comprises:
   a plurality of pairs of transport rollers; and the wetting means comprises:
   a dribble and spray bar positioned above and generally transverse to the direction of travel of the material through the apparatus, the bar adapted to dribble water to wet a pair of the rollers between the first station and the second station and adapted to spray water onto the brushing means.

5. The apparatus of claim 1, wherein the transporting means comprises:
   a plurality of pairs of transport rollers; and the wetting means comprises:
   a dribble and spray bar positioned above and generally transverse to the direction of travel of the material through the apparatus, the bar adapted to dribble water to wet a pair of the rollers between the second station and the dryer and adapted to spray water onto the brushing means.

6. The apparatus of claim 1, wherein the brushing means comprises:
- a cylindrical brush having a longitudinal axis positioned above and generally transverse to the direction of travel of the material through the apparatus; and
- means for rotating the brush about its axis and oscillating the brush along its axis.

7. The apparatus of claim 1, wherein the secondary developing station further comprises:
- a flat or substantially flat platform positioned a distance generally beneath the brushing means such that the material is in contact with the brushing means and the platform when the material is transported between them by the transporting means; and
- means for adjusting the distance between the brushing means and the platform.

8. The apparatus of claim 1, wherein the wash system further comprises:
- a first water collection compartment positioned generally beneath the primary developing station; and
- a second water collection compartment positioned generally beneath the secondary developing station.

9. The apparatus of claim 1, wherein the wash system further comprises:
- a reservoir tank having a first inlet port and a first outlet port;
- a mixing tee connected to the first inlet port;
- a first piping or hose network connected to the mixing tee, the first network for connection to a pressurized supply of cold water, the first network including a first solenoid valve capable of turning flow on and off through the first network;
- a second piping or hose network connected to the mixing tee, the second network for connection to a presurized supply of hot water, the second network including a second solenoid valve capable of turning flow on and off through the second network; and
- a third piping or hose network connected to the first outlet port, the spraying means the prewetting means and the wetting means, the third piping network including a pump for pumping water from the tank through the third network and a third solenoid valve capable of turning flow on and off to the spraying means.

10. The apparatus of claim 9, wherein the wash system further comprises:
- a first water collection compartment positioned generally beneath the primary developing station, the first compartment having an outlet;
- a fourth piping or hose network connected to the first compartment outlet and for connection to a drain;
- a second water collection compartment positioned generally beneath the secondary developing station, the second compartment having an outlet; and
- a fifth piping or hose network connected to the second compartment outlet and a second inlet of the tank allowing water in the second compartment to drain into the tank.

11. The apparatus of claim 9, wherein the control system comprises:
- a high temperature sensor adapted to sense the temperature of the water in the tank and to generate a signal when the water temperature is at or above a first temperature limit;
- a low temperature sensor adapted to sense the temperature of the water in the tank and to generate a signal when the water temperature is at or above a second temperature limit; and
- opening and closing means responsive to the high and low temperature sensors for opening the second solenoid valve only when neither one of the temperature sensors is generating a signal, opening the first solenoid valve and the second solenoid valve only when the high temperature sensor is generating a signal, and opening the first solenoid valve only when the low temperature sensor and the high temperature sensor are generating a signal.

12. The apparatus of claim 11, wherein the control system further comprises:
- a float activated sensor adapted to generate a signal when the water level in the tank reaches an operating level of interest; and
- the opening and closing means is also responsive to the float activated sensor such that when a signal is generated by the float activated sensor the opening and closing means closes or maintains closed both the first and the second solenoid valves.

13. The apparatus of claim 12, wherein the opening and closing means comprises:
- a programable logic controller; and
- a plurality of lines connecting the high temperature sensor, the low temperature sensor and the float activated sensor as inputs to the programable logic controller; and
- a plurality of lines connecting the first solenoid valve and the second solenoid valve between outputs from the programable logic controller and means for connecting to a power source.

14. The apparatus of claim 1, wherein the dryer comprises:
- a pair of opposed heater and blower units positioned to blow hot air on opposite sides of the material as it is transported through the dryer by the transporting means; and
- the heater and blower units pivotably supported by generally U-shaped saddle clamps and detachably fastened to a remainder of the apparatus by resilient clips.

15. The apparatus of claim 14, wherein each one of the heater and blower units comprise:
- a housing having a plurality of fresh air inlet ports, a plurality of preheated air inlet ports and at least one air outlet port;
- a plurality of fans supported in the housing with air intake sides positioned near the fresh air inlet ports;
- a heating element supported on the housing on air outlet sides of the fans; and
- means for adjusting the volume of air permitted to enter the fresh air inlet ports,
- whereby the adjusting means can be adjusted to permit any amount of air from and including all of the air drawn into the fans to be fresh air drawn through the fresh air inlet ports to all of the air drawn into the fans to be preheated air drawn through the preheated air inlet ports.

16. The apparatus of claim 1, wherein the transporting means includes:
- a motor assembly;
- a plurality of conveyor rollers;
- a gear arrangement interconnecting the rollers;
- a clutch mechanism interconnecting the motor assembly and the gear arrangement;

a handle connected to one of the rollers such that when the handle is turned one direction the clutch disengages the motor assembly allowing the rollers to rotate without turning the motor assembly to facilitate cleaning of the rollers.

17. The apparatus of claim 1, wherein the web or sheet of material comprises a photosensitive element having an aqueously developable layer containing a colorant, the non-image portions being part of the layer, such that when the element is processed by the apparatus the processed element forms a colored image on a support.

18. An apparatus for processing a photosensitive element having an aqueously developable layer containing a colorant to form a colored image on a substrate, comprising:
 a wash system comprising:
  a primary developing station comprising means for spraying water on the element such that most non-image portions of the aqueously developable toner layer are washed away; and
  a secondary developing station comprising a cylindrical brush positioned above and generally transverse to the direction of travel of the element through the apparatus, a flat or substantially flat platform positioned generally beneath the brush such that the element is in contact with the brush and the platform when the element is transported between them, and means for rotating and oscillating the brush to remove or substantially remove a remainder of the non-image portions of the aqueously developable layer;
 a dryer for drying the processed element;
 means for transporting the element in order through the first developing station, the second developing station, and the dryer; and
 a control system for automatically controlling the wash system, the dryer and the transporting means.

19. An apparatus for processing a photosensitive element having an aqueously developable layer containing a colorant to form a colored image on a substrate, comprising:
 a wash system comprising:
  a primary developing station comprising means for spraying water on the element such that most non-image portions of the aqueously developable toner layer are washed away;
  a secondary developing station comprising means for brushing the element to remove or substantially remove a remainder of the non-image portions of the aqueously developable toner layer;
  a reservoir tank having a first inlet port and a first outlet port;
  a mixing tee connected to the first inlet port;
  a first piping or hose network connected to the mixing tee, the first network for connection to a pressurized supply of cold water, the first network including a first solenoid valve capable of turning flow on and off through the first network;
  a second piping or hose network connected to the mixing tee, the second network for connection to a pressurized supply of hot water, the second network including a second solenoid valve capable of turning flow on and off through the second network; and
  a third piping or hose network connected to the first outlet port and the spraying means, the third piping network including a pump for pumping water from the tank through the third network and a third solenoid valve capable of turning flow on and off to the spraying means;
  a first water collection compartment positioned generally beneath the primary developing station, the first compartment having an outlet;
  a fourth piping or hose network connected to the first compartment outlet and for connection to a drain;
  a second water collection compartment positioned generally beneath the secondary developing station, the second compartment having an outlet; and
  a fifth piping or hose network connected to the second compartment outlet and a second inlet of the tank allowing water in the second compartment to drain into the tank;
 a dryer for drying the processed element;
 means for transporting the element in order through the first developing station, the second developing station, and the dryer, the transporting means including the element transport rollers; and
 a control system for automatically controlling the wash system, the dryer and the transporting means.

* * * * *